United States Patent [19]

Mojarradi et al.

[11] Patent Number: 5,577,617
[45] Date of Patent: Nov. 26, 1996

[54] ADVANCED TECHNIQUE FOR PACKAGING MULTIPLE NUMBER OF ELECTRICALLY STACKABLE HIGH VOLTAGE TRANSISTORS IN ONE PACKAGE

[75] Inventors: Mohammad M. Mojarradi, Pullman, Wash.; Dennis W. Sandstrom, Sylman, Calif.; Tuan A. Vo, Hawthorne, Calif.; Abdul Elhatem, Redondo Beach, Calif.

[73] Assignee: Xerox Corporation, Stamford, Conn.

[21] Appl. No.: 581,385

[22] Filed: Dec. 29, 1995

[51] Int. Cl.⁶ .................................................. B65D 73/02
[52] U.S. Cl. ....................... 206/724; 206/722; 206/701; 174/52.4
[58] Field of Search .................................. 206/701, 722, 206/724, 726, 728; 174/52.4

[56] References Cited

U.S. PATENT DOCUMENTS

| | | | |
|---|---|---|---|
| 4,180,161 | 12/1979 | Henrickson et al. | 206/724 |
| 4,329,642 | 5/1982 | Luthi et al. | 206/724 |
| 4,547,794 | 10/1985 | Tang | 206/724 |
| 4,591,053 | 5/1986 | Alemanni | 206/724 |
| 4,765,471 | 8/1988 | Murphy | 206/728 |
| 5,375,710 | 12/1994 | Hayakawa et al. | 206/724 |
| 5,530,204 | 6/1996 | Kondo et al. | 174/52.4 |

*Primary Examiner*—David T. Fidei
*Attorney, Agent, or Firm*—Nola Mae McBain

[57] ABSTRACT

High voltage circuitry often requires assembling an array of high voltage devices that are electrically isolated from one another. A lead frame that fits within conventional plastic packaging has been designed that will allow electrical isolation of the substrates of two or more transistors mounted together in a single package.

3 Claims, 2 Drawing Sheets

ADVANCED TECHNIQUE FOR PACKAGING MULTIPLE NUMBER OF ELECTRICALLY STACKABLE HIGH VOLTAGE TRANSISTORS IN ONE PACKAGE

BACKGROUND

This invention relates generally to packaging high voltage devices and more particularly concerns assembling an array of high voltage devices that are electrically isolated from one another on a lead frame that fits within conventional plastic packaging.

High voltage transistors have maximum voltage limitations. When a high voltage circuit is needed for a voltage greater than that sustainable by an individual high voltage transistor, several transistors are used to share the voltage between them. For instance, a circuit capable of sustaining 3000 volts may be made from a collection of transistors capable of each sustaining 1500 volts. This is done by having the substrates of some transistors at ground voltage and the substrates of some transistors at 1500 volts so that any one individual transistor only sees the 1500 volt drop it is capable of sustaining.

Packaging these high voltage transistors has been problematic because of the different substrate voltages needed. The substrates of the individual transistors must be kept electrically isolated from each other so that each transistor can maintain its appropriate voltage drop over the correct range of voltages. Current single tab lead frame designs do not provide the necessary electrical isolation of the substrates of the transistors, therefore the only way to accomplish this has been to package each transistor separately and then mount and connect the packages on a circuit board. This requires a great deal of board space. If a lead frame were available that provided electrical isolation of the substrates of two or more transistors then multiple transistors could be mounted together in a single package saving considerable board space and complexity.

Accordingly, it is the primary aim of the invention to provide a single lead frame that will allow for the mounting of two or more transistors with electrically isolated substrates within a single package.

SUMMARY OF THE INVENTION

Briefly stated and in accordance with the present invention, there is provided a method of packaging high voltage chips in low voltage packaging by using a unique lead frame that electrically isolates the substrate of the individual chips from one another.

Figure 1:
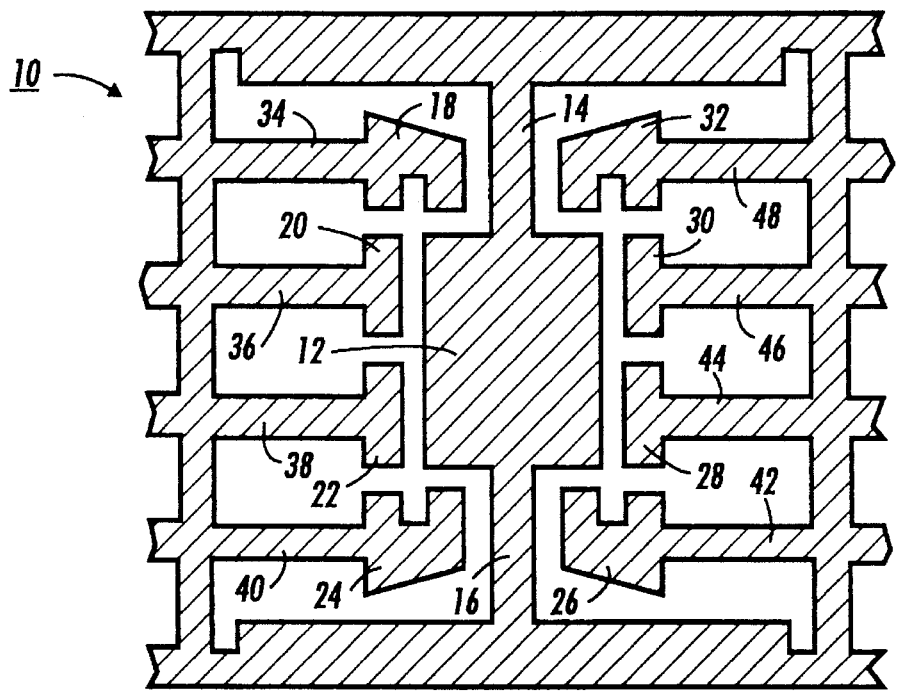
FIG. 1 shows a top view of a conventional prior art packaging of a high voltage device in a plastic eight, dual in line pin package.

While the present invention will be described in connection with a preferred embodiment and method of use, it will be understood that it is not intended to limit the invention to either that embodiment or procedure. On the contrary, it is intended to cover all alternatives, modifications and equivalents as may be included within the spirit and scope of the invention as defined by the appended claims.

Alpha-Numeric List of Elements
breakaway line B1
breakaway line B2
packaging line P
lead frame 10
die mount tab 12
die mount tab support arm 14
die mount tab support arm 16
bonding pad 18
bonding pad 20
bonding pad 22
bonding pad 24
bonding pad 26
bonding pad 28
bonding pad 30
bonding pad 32
bonding pad support arm 34
bonding pad support arm 36
bonding pad support arm 38
bonding pad support arm 40
bonding pad support arm 42
bonding pad support arm 44
bonding pad support arm 46
bonding pad support arm 48
lead frame 50
die mount tab area 52
die mount tab support arm 54
die mount tab support arm 56
bonding pad 58
bonding pad 60
bonding pad 62
bonding pad 64
bonding pad 66
bonding pad 68
bonding pad 70
bonding pad 72
bonding pad support arm 74
bonding pad support arm 76
bonding pad support arm 78
bonding pad support arm 80
bonding pad support arm 82
bonding pad support arm 84
bonding pad support arm 86
bonding pad support arm 88
die mount tab 90
die mount tab 92
support arm 94
lead frame 100
die mount tab 102
die mount tab 104
die mount tab support arm 106
die mount tab support arm 108
die mount tab support arm 110
die mount tab support arm 112
bonding pad 114
bonding pad 116
bonding pad 118
bonding pad 120
bonding pad support arm 122
bonding pad support arm 124
bonding pad support arm 126
bonding pad support arm 128
lead frame edge 129
lead frame 130
die mount tab 132 die mount tab 134
die mount tab support arm 136
die mount tab support arm 138
die mount tab support arm 140
die mount tab support arm 142
bonding pad 144
bonding pad 146
bonding pad 148
bonding pad 150
bonding pad 152
bonding pad 154
bonding pad support arm 156
bonding pad support arm 158
bonding pad support arm 160
bonding pad support arm 162
bonding pad support arm 164
bonding pad support arm 166
lead frame edge 168

DETAILED DESCRIPTION OF THE INVENTION

FIG. 1 shows a conventional lead frame 10. The lead frame 10 has a die mount tab 12 supported by two die mount tab support arms 14, 16. The lead frame 10 also has 8 bonding pads 18, 20, 22, 24, 26, 28, 30, 32 supported by eight bonding pad support arms 34, 36, 38, 40, 42, 44, 46, 48.

Figure 2:
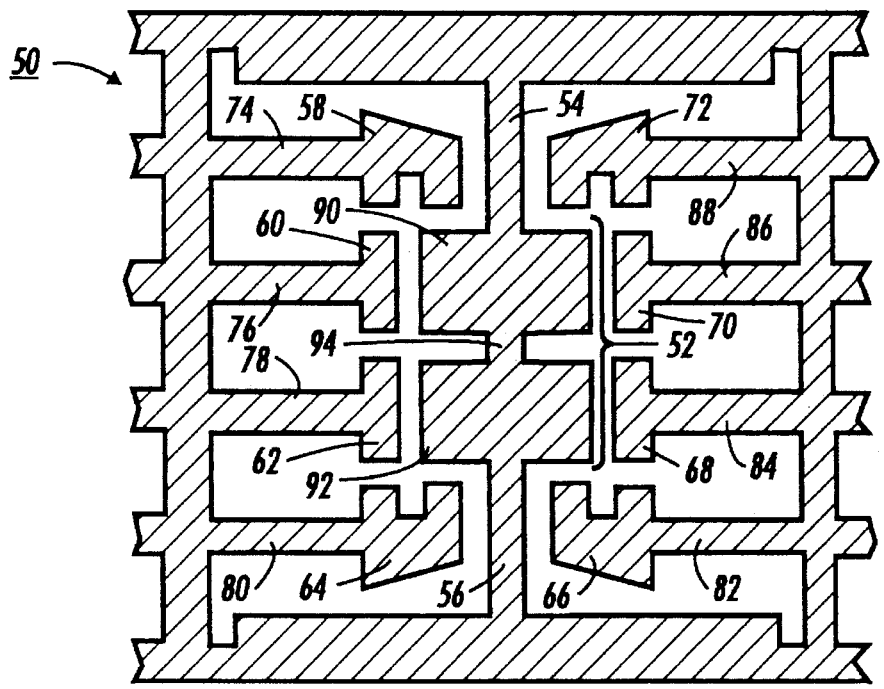
FIG. 2 shows a top view of a conventional multi die mount tab lead frame.

FIG. 2 shows a conventional lead frame 50 for mounting two dies on a single lead frame within a single package. The lead frame 50 has a die mount tab area 52 supported by two die mount tab support arms 54, 56. The lead frame 50 also has 8 bonding pads 58, 60, 62, 64, 66, 68, 70, 72 supported by eight bonding pad support arms 74, 76, 78, 80, 82, 84, 86, 88. The die mount tab area 52 is modified from the die mount tab 12 shown in FIG. 1 to mount two dies. The die mount tab area 52 has two die mount tabs 90, 92 connected by a support arm 94. The lead frame 50 is made out of metal, typically a nickel plated copper, so die mount tab 90 and die mount tab 92 are electrically connected through support arm 94.

Figure 3:
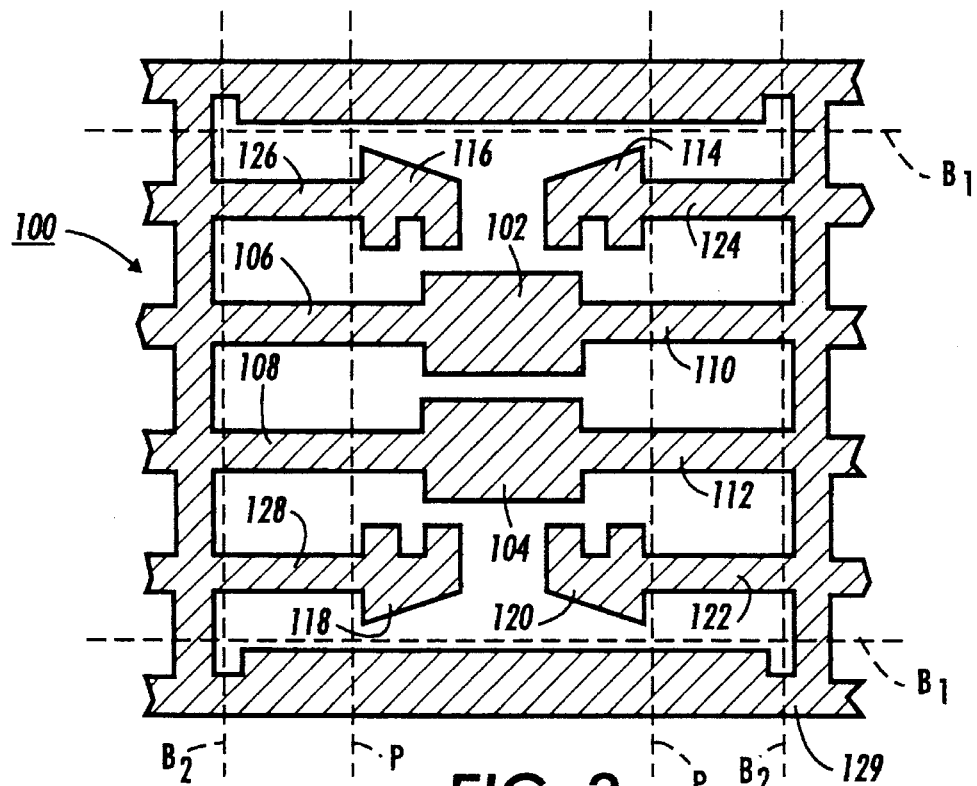
FIG. 3 shows a top view of electrically isolated multi die mount tab lead frame.

FIG. 3 shows a top view of electrically isolated multi die mount tab lead frame 100. There are two separate die mount tabs 102, 104. Die mount tab 102 is supported by two die mount tab support arms 106, 110 and die mount tab 104 is supported by two separate die mount tab support arms 108, 112. Unlike the two die mount tabs 90, 92 in die mount tab area 52 shown in FIG. 2, the die mount tabs 102, 104 shown in FIG. 3 are completely separated from each other and supported only by each die mount tab's respective die mount tab support arms.

To avoid confusion, although the die mount tab support arms 106, 108, 110, 112 and the bonding pad support arms appear to be connected to each other 122, 124, 126, 128 through lead frame edge 129 around the perimeter of lead frame 100, when the lead frame 100 is mounted or molded into a package the lead frame edge 129 will be completely removed along breakaway lines B1 and B2 and the die mount tab support arms 106, 108, 110, 112 and the bonding pad support arms 122, 124, 126, 128 will be completely isolated from one another.

The additional space within lead frame 100 needed for the extra die mount tab support arms to provide completely separate support for the second die mount tab was gained at the cost of four bonding pads. Therefore, in contrast to the lead frame 10 shown in FIG. 1 or lead frame 50 shown in FIG. 2, lead frame 100 shown in FIG. 3 only has 4 bonding pads 114, 116, 118, 120 instead of 8. The reduced number of bonding pads 114, 116, 118, 120 requires a reduced number of bonding pad support arms 122, 124, 126, 128. The die mount tab support arms 106, 108, 110, 112 use the space in the lead frame 100 that would have been used by the four eliminated bonding pad support arms. Putting the die mount tab support arms 106, 108, 110, 112 in the space previously used for bonding pad support arms allows each of the die mount tabs 102, 104 to have two die mount tab support arms 106, 108, 110, 112 that are attached to the die mount tabs on opposing sides of the die mount tab 102, 104. This configuration provides the greatest amount of support and stability to the die mount tabs 102, 104.

Figure 4:
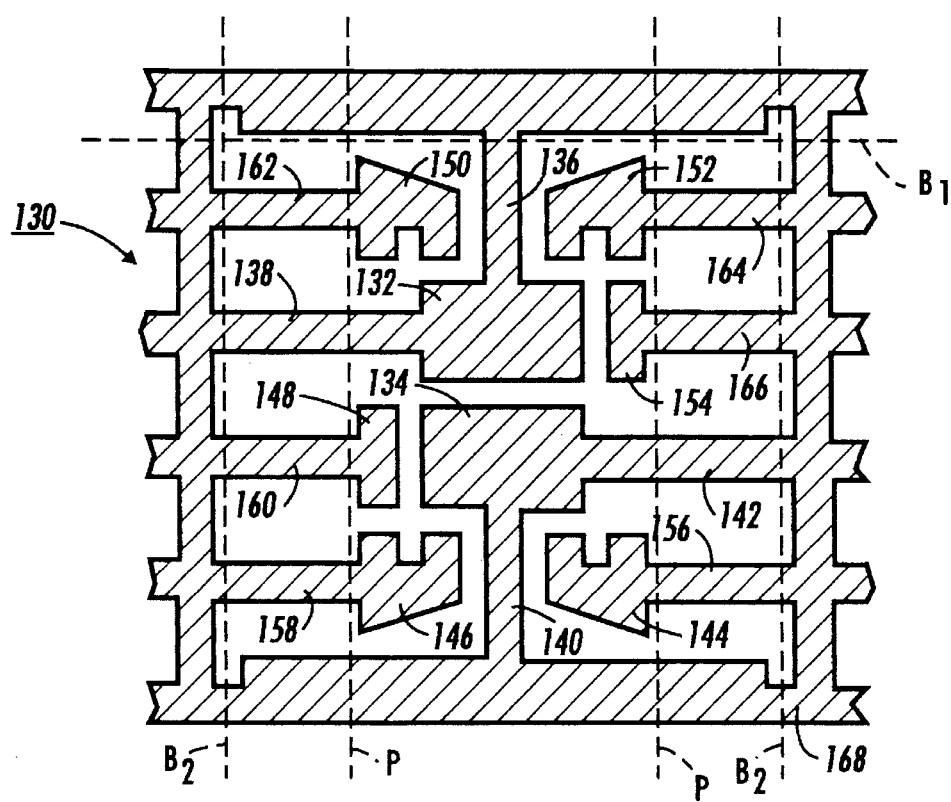
FIG. 4 shows a top view of an alternative embodiment of an electrically isolated multi die mount tab lead frame.

FIG. 4 shows a top view of an alternative embodiment of an electrically isolated multi die mount tab lead frame 130. Like lead frame 100 shown in FIG. 3, lead frame 130 has two die mount tabs 132, 134. Die mount tab 132 is supported by two die mount tab support arms 136, 138 and die mount tab 134 is supported by two die mount tab support arms 140, 142. However, a different configuration of the die mount tab support arms 136, 138, 140, 142 is used from the configuration used in lead frame 100 shown in FIG. 3. In lead frame 130, shown in FIG. 4 the die mount tab support arms 136, 138, 140, 142 are attached to adjacent sides, rather than opposing sides of the die mount tabs 132, 134 respectively. This configuration provides less stability and support for the die mount tabs 132, 134 but allows room for the lead frame 130 to have two additional bonding pads, when compared with lead frame 100 shown in FIG. 3.

Lead frame 130, shown in FIG. 4, has 6 bonding pads 144, 146, 148, 150, 152, 154; each one supported by its respective bonding pad support arm 156, 158, 160, 162, 164, 166. By moving the die mount tab support arms 136, 140 from the opposing side of the die mount tabs 132, 134 from the die mount tab support arms, 138, 142 space is regained for two bonding pads 154, 148 and their respective bonding pad support arms 166, 160 at the cost of some stability and support for the die mount tabs 132, 134.

As in the example of lead frame 100 shown in FIG. 3, complete isolation of the die mount tab support arms 106, 108, 110, 112 and bonding pad support arms 122, 124, 126, 128 will be accomplished when the lead frame 130 is mounted or molded inside a package and lead frame edge 168 around the perimeter of lead frame 130 is removed along breakaway lines B1, B2.

Further isolation of the die also occurs when either lead frame 100 or lead frame 130 is molded into a plastic package. During the conventional packaging process, plastic or an isolating epoxy fills in the area between breakaway lines B1 and packaging lines P. The plastic or isolating epoxy encapsulates the die mounted on the die mount tabs further isolating them from each other. This encapsulation provides further isolation because the dielectric constant of the encapsulant is much greater than air.

We claim:

1. An electrically isolated multi die mount tab lead frame having a lead frame edge which is removed prior to assembly onto a printed wiring board comprising:

a) a lead frame edge defining the perimeter of the lead frame and the space enclosed by said lead frame edge is an interior space, b) at least two die mount tabs and at least four bonding pads being located in the interior space, c) at least four bonding pad support arms, each bonding pad support arm having two ends, d) at least four die mount tab support arms, each die mount tab support arm having two ends, and e) each die mount tab being attached to said lead frame edge by two die mount tab support arms, where one end of each die mount tab support arm is attached to said lead frame edge and the other end of each die mount tab is attached to said die mount tab, each die mount tab being unattached to each other except through said lead frame edge and f) each bonding pad being attached to said lead frame edge by one bonding pad support arm, where one end of each bonding pad support arm is attached to said lead frame and the other end of each bonding pad support arm is attached to said bonding pad.

2. The lead frame of claim 1 wherein said two die mount tab support arms, used for attaching each die mount tab, extend generally in the same direction.

3. The lead frame of claim 1 wherein said two die mount tab support arms, used for attaching each die mount tab, extend generally perpendicular to each other.

* * * * *